(12) United States Patent
Chen

(10) Patent No.: US 7,176,539 B2
(45) Date of Patent: Feb. 13, 2007

(54) LAYOUT OF SEMICONDUCTOR DEVICE WITH SUBSTRATE-TRIGGERED ESD PROTECTION

(75) Inventor: Shiao-Shien Chen, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 10/904,214

(22) Filed: Oct. 29, 2004

(65) Prior Publication Data

US 2006/0091465 A1   May 4, 2006

(51) Int. Cl.
*H01L 29/76* (2006.01)
*H01L 29/94* (2006.01)
*H01L 31/00* (2006.01)

(52) U.S. Cl. ............... 257/409; 257/356; 257/E29.012
(58) Field of Classification Search ............... 257/355, 257/356, 360–362, 546; 361/100, 101
See application file for complete search history.

(56) References Cited

U.S. PATENT DOCUMENTS

| | | | |
|---|---|---|---|
| 6,576,958 B2 * | 6/2003 | Ker et al. ............... 257/355 |
| 6,639,283 B1 * | 10/2003 | Hung et al. ............... 257/355 |
| 2003/0047786 A1 * | 3/2003 | Lee et al. ............... 257/355 |
| 2003/0197246 A1 * | 10/2003 | Ker et al. ............... 257/565 |
| 2004/0031998 A1 * | 2/2004 | Chen et al. ............... 257/409 |
| 2004/0051146 A1 * | 3/2004 | Ker et al. ............... 257/356 |
| 2004/0052020 A1 * | 3/2004 | Ker et al. ............... 361/56 |
| 2004/0070900 A1 * | 4/2004 | Ker et al. ............... 361/56 |

* cited by examiner

*Primary Examiner*—George Fourson
*Assistant Examiner*—John M. Parker
(74) *Attorney, Agent, or Firm*—Winston Hsu

(57) ABSTRACT

A semiconductor device with substrate-triggered ESD protection has a guard ring, a first MOS transistor array, a second MOS transistor array, a substrate-triggered portion, and an N-well. The first MOS transistor array, the second MOS transistor array, the substrate-triggered portion, and the N-well are formed in a region surrounded by the guard ring, and the substrate-triggered portion is located between the first MOS transistor array and the second MOS transistor array. When the ESD event occurs, the N-well is biased for directing a trigger current.

25 Claims, 22 Drawing Sheets

LAYOUT OF SEMICONDUCTOR DEVICE WITH SUBSTRATE-TRIGGERED ESD PROTECTION

BACKGROUND OF INVENTION

1. Field of the Invention

The invention relates to a semiconductor device and, more particularly, to a semiconductor device with substrate-triggered electrostatic discharge (ESD) protection.

2. Description of the Prior Art

With the continued scaling down of semiconductor integrated circuit (IC) devices, the present trend is moving towards production of semiconductor integrated circuits having very small sizes in the advanced sub-quarter-micron CMOS technologies. It is consequently increasingly important to build electrostatic discharge (ESD) protection circuits on the chip to protect the devices and circuits of the IC against ESD-related damage. The ESD robustness of commercial IC products is generally needed to be higher than 2 kV in the human-body-model (HBM) ESD stress. While withstanding ESD overstress, it is desired that the on-chip ESD protection circuits have relatively small dimensional requirements to save silicon area. With respect to this issue, heat dissipation issues become paramount. In the present, the efficiency and performance of the substrate-trigger ESD protection circuits is better than other type ESD protection circuits.

Please refer to FIG. 1. FIG. 1 is schematic diagram of a prior art semiconductor device 30 with substrate-triggered ESD technique. The semiconductor device 30 is disclosed in U.S. Pat. No. 6,639,283 "Semiconductor device with substrate-triggered ESD protection" by Kei-Kang et al. The semiconductor device 30 has a guard ring 31 and a MOS transistor array 32. The MOS transistor array 32 has a plurality of MOS transistors 321, a plurality of fingers 322 constituted by the gates of the MOS transistors 321, and a plurality of substrate-triggered areas 323 between the fingers 322. As shown in FIG. 2, a plurality of $N^+$ diffusion areas and a plurality of $P^+$ diffusion areas are formed on a substrate 40. The $N^+$ diffusion areas serve as the source and the drain of the MOS transistors 321 shown in FIG. 1, respectively. The periphery $P^+$ diffusion area serves as the guard ring 31 shown in FIG. 1. The $N^+$ diffusion areas and the substrate 40 form the parasitic bipolar junction transistors (parasitic BJTs) 43 and 44. Thus, the junction between the base and the emitter of each parasitic BJT 43 and 44 is forward biased by the ESD pulse, such as of a human-body mode (HBM), in order to trigger the parasitic BJTs 43 and 44 into an active region. Thus, the MOS transistor array 32 can be protected. The semiconductor device 30 has a plurality of $P^+$ diffusion areas 41 and a plurality of isolation portions 42. Each of the isolation portions 42 can be a shallow trench isolation (STI) portion for separating the $P^+$ diffusion areas 41 from the $N^+$ diffusion areas. Thus, when the ESD event occurs, the trigger current $I_{trig}$ flows through the $P^+$ diffusion areas 41 to the substrate 40, and then the bases of parasitic BJTs 43 and 44 are biased. Accordingly, the parasitic BJTs 43 and 44 can be triggered simultaneously to discharge the electrostatic charge.

However, since three substrate-triggered areas 323 (as shown in FIG. 1) have to be provided for four fingers 322, these substrate-triggered areas 323 may increase the area of the circuit layout. The manufacturing cost of the semiconductor device 30 is thus increased.

Please refer to FIG. 3, Kei-Kang et al. discloses another prior art semiconductor device 50 with substrate-triggered ESD protection technique. The semiconductor device 5 has a guard ring 51, a first MOS transistor array 52, a second MOS transistor array 53, a substrate-triggered portion 54 and an isolation portion 55. The first MOS transistor array 52, the second MOS transistor array 53, the substrate-triggered portion 54, and the isolation portion 55 are formed in a region surrounded by the guard ring 51. The substrate-triggered portion 54 is located between the first MOS transistor array 52 and the second MOS transistor array 53. In addition, the isolation portion 55 is formed among the guard ring 51, the first MOS transistor array 52, the second MOS transistor array 53, and the substrate-triggered portion 54 so as to separate these regions.

Please refer to FIGS. 4–5. FIG. 4 is a cross-sectional diagram of the semiconductor device 50 along the dashed line 4-4' shown in FIG. 3. FIG. 5 is a cross-sectional diagram of the semiconductor device 50 along the dashed line 5-5' shown in FIG. 3. The guard ring 51 is formed on a $P^+$ diffusion area 61 of a substrate 60. In addition, the first MOS transistor array 52, the second MOS transistor array 53, the substrate-triggered portion 54 and the isolation portion 55 can be an $N^+$ diffusion area 62, an $N^+$ diffusion area 63, a $P^+$ diffusion area 64, and a shallow trench isolation (STI) portion 65 formed on the substrate 60, respectively. It is obvious from FIG. 4 that the shallow trench isolation portion 65 isolates the $N^+$ diffusion area 62, the $N^+$ diffusion area 63, and the $P^+$ diffusion area 64 from one another.

As stated above, the first MOS transistor array 52 and the second MOS transistor array 53 has a parasitic BJT 521 (as shown in FIG. 6) respectively. When the ESD event occurs, the trigger current $I_{trig}$ can flow through the $P^+$ diffusion area 64 to the $P^+$ diffusion area 61 serving as the guard ring 51, so as to produce a voltage drop. The voltage drop is the product of the trigger current $I_{trig}$ and the substrate resistor $R_{sub}$, and is capable of forward-biasing the base-emitter junctions of the parasitic BJTs 521 into active states, so as to enable the parasitic BJTs 521 to discharge the electrostatic charge.

However, because the distance between the guard ring 51 and the end of the substrate-triggered portion 54 is less than the distance between the guard ring 51 and the center of the substrate-triggered portion 54, the resistance between the guard ring 51 and the end of the substrate-triggered portion 54 is less than the resistance between the guard ring 51 and the center of the substrate-triggered portion 54. Therefore, the trigger current $I_{trig2}$ (as shown in FIG. 5) should be greater than the trigger current $I_{trig1}$ (as shown in FIG. 4), where $I_{trig}=I_{trig1}+I_{trig2}$. Hence, most of the trigger current $I_{trig}$ passes from the two ends of the substrate-triggered portion 54 to the guard ring 51. The base-emitter junctions of the parasitic BJTs 521, thus, are hard to be forward-biased, and the ESD performance of the semiconductor device 50 is undesired.

Please refer to FIG. 7, Kei-Kang et al. discloses another prior art semiconductor device 70 with substrate-triggered ESD protection technique. The semiconductor device 70 further comprises a first N-well 56 and a second N-well 57. The first N-well 56 and the second N-well 57 are formed between the first MOS transistor array 52 and the second MOS transistor array 53, and are located near two ends of the substrate-triggered portion 54, respectively. Since the first N-well 56 and the second N-well 57 are N diffusion areas that are deeply diffused into the substrate, and the substrate-triggered portion 54 is a $P^+$ diffusion area, when the ESD event occurs, the trigger current flows from the substrate-triggered portion 54 to the substrate. At this time, due to the blocking effects of the first N-well 56 and the second N-well 57, the trigger current components toward the first N-well 56 and the second N-well 57 decrease. Consequently, the trigger current components toward the first MOS transistor array 52 and the second MOS transistor array 53 correspondingly increase. In this case, the trigger current can more easily bias the bases of the parasitic BJTs in the first MOS transistor array 52 and the second MOS transistor array 53.

In contrast with the semiconductor devices 30 and 50, even through the semiconductor device 70 had been improved, the semiconductor device 70 has a drawback that the first N-well 56 and the second N-well 57 are too short to effectively block the trigger current components toward the first N-well 56 and the second N-well 57.

SUMMARY OF INVENTION

It is a primary objective of the present invention to provide an advanced semiconductor device with substrate-triggered electrostatic discharge (ESD) protection to resolve the above problems.

The semiconductor device has a guard ring with four sides formed in a substrate for surrounding a region, a plurality of contacting pads formed on the guard ring along a first direction and arranged as two lines oppositely positioned at two of the four sides of the guard ring, a first metal-oxide-semiconductor (MOS) transistor array formed in the region having at least one first gate extending along the first direction, a second MOS transistor array formed in the region having at least one second gate extending along the first direction, a substrate-triggered portion positioned between the first MOS transistor array and the second MOS transistor array and extending along the first direction, and at least a along the first direction formed in the region and connected to drains of the MOS transistors for simultaneously directing a trigger current to both of the two lines of the contacting pads when an ESD event occurs. None of the contacting pads is positioned at the other two sides of the guard ring. The guard ring is connected to a first node via the contacting pads.

When an ESD event occurs, the N-Well is capable of effectively simultaneously directing the trigger current to both of the contacting pads positioned at two opposite sides of the guard ring. Therefore, the bases of the parasitic BJTs in the first MOS transistor array and the second MOS transistor array can be more effectively biased.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
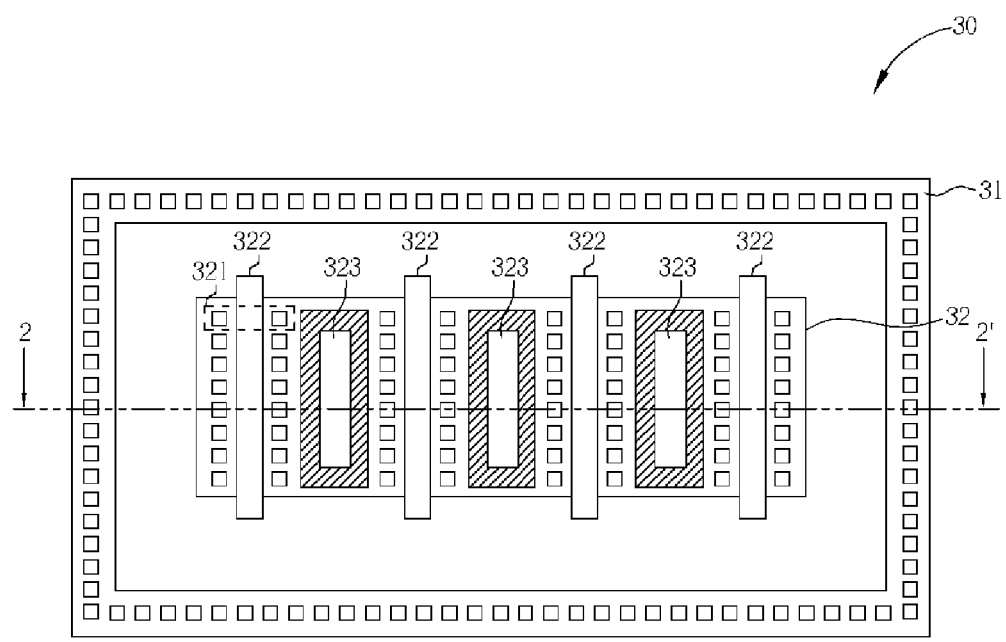
FIG. 1 is layout diagram of a prior art semiconductor device with ESD protection.
Figure 2:
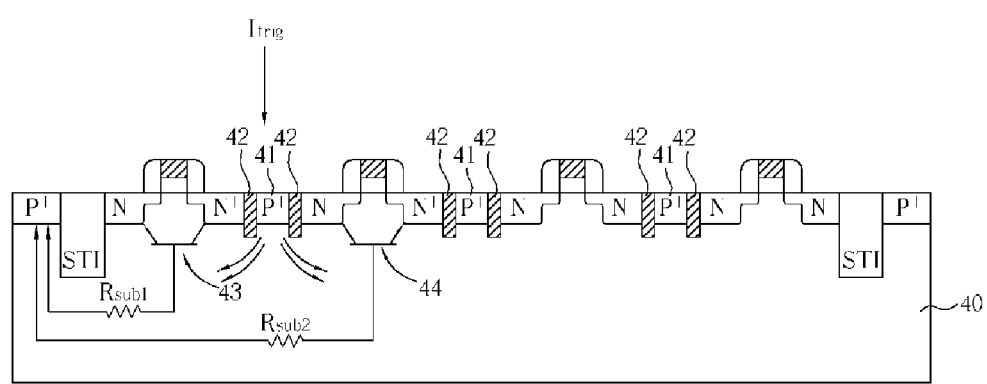
FIG. 2 is a cross-sectional diagram of the semiconductor device taken along a line 2–2' in FIG. 1.
Figure 3:
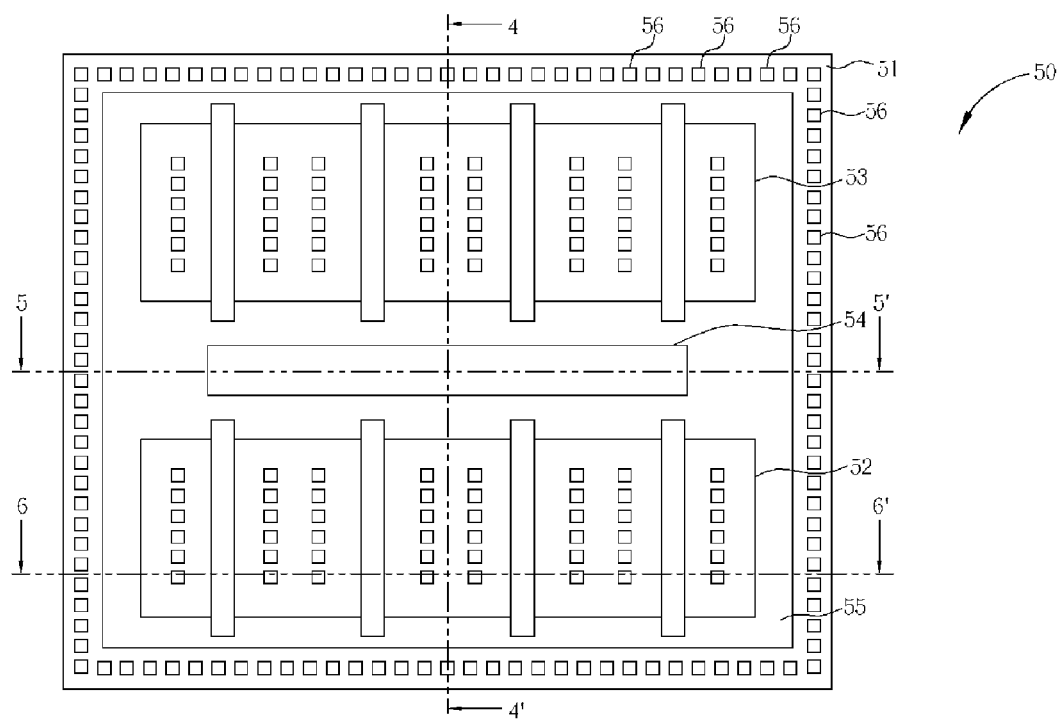
FIG. 3 is layout diagram of another prior art semiconductor device with ESD protection.
Figure 4:
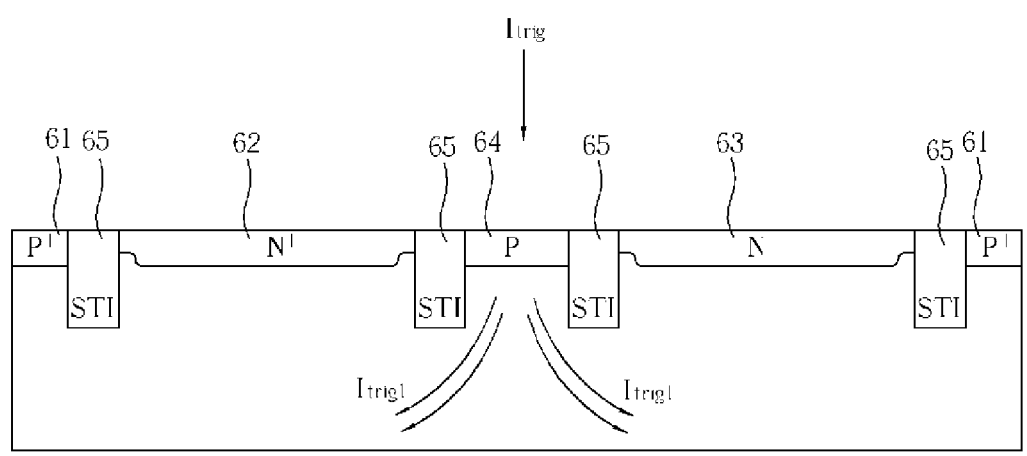
FIG. 4 is a cross-sectional diagram of the semiconductor device taken along a line 4–4' in FIG. 3.
Figure 5:
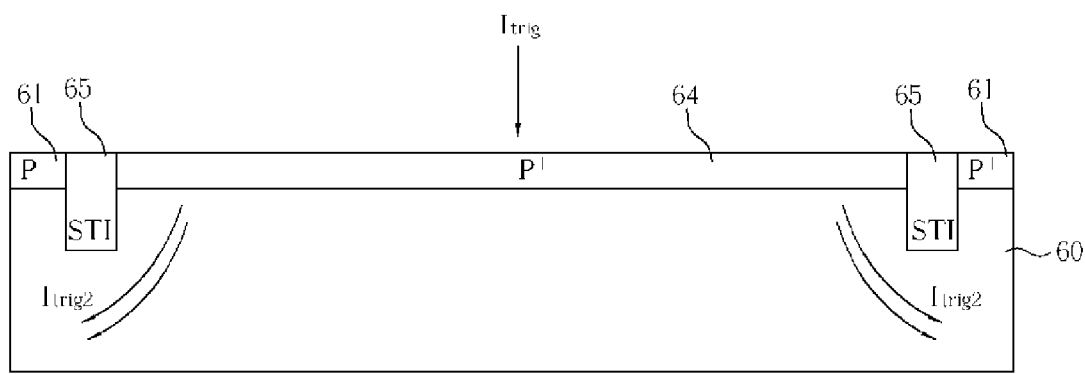
FIG. 5 is a cross-sectional diagram of the semiconductor device taken along a line 5–5' in FIG. 3.
Figure 6:
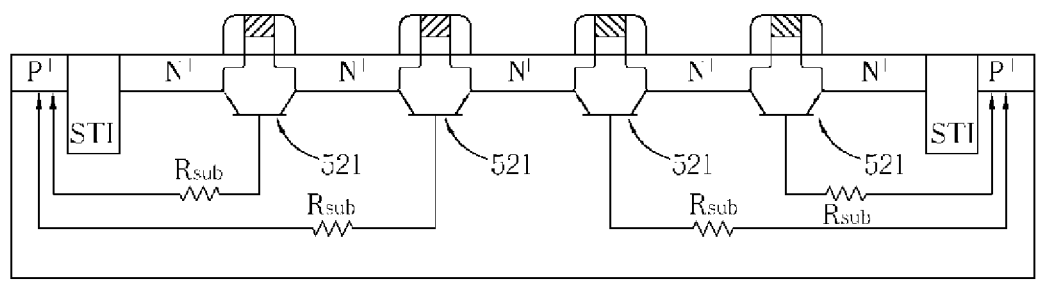
FIG. 6 is a cross-sectional diagram of the semiconductor device taken along a line 6–6' in FIG. 1.
Figure 7:
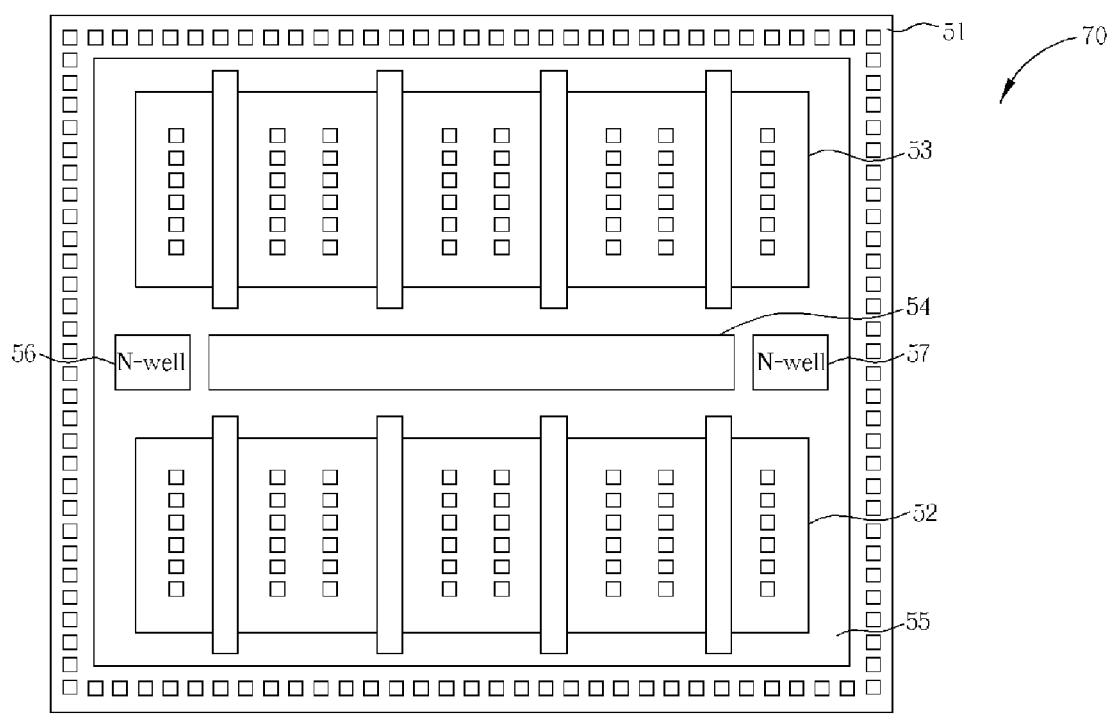
FIG. 7 is schematic diagram of another prior art semiconductor device with ESD protection.
Figure 8:
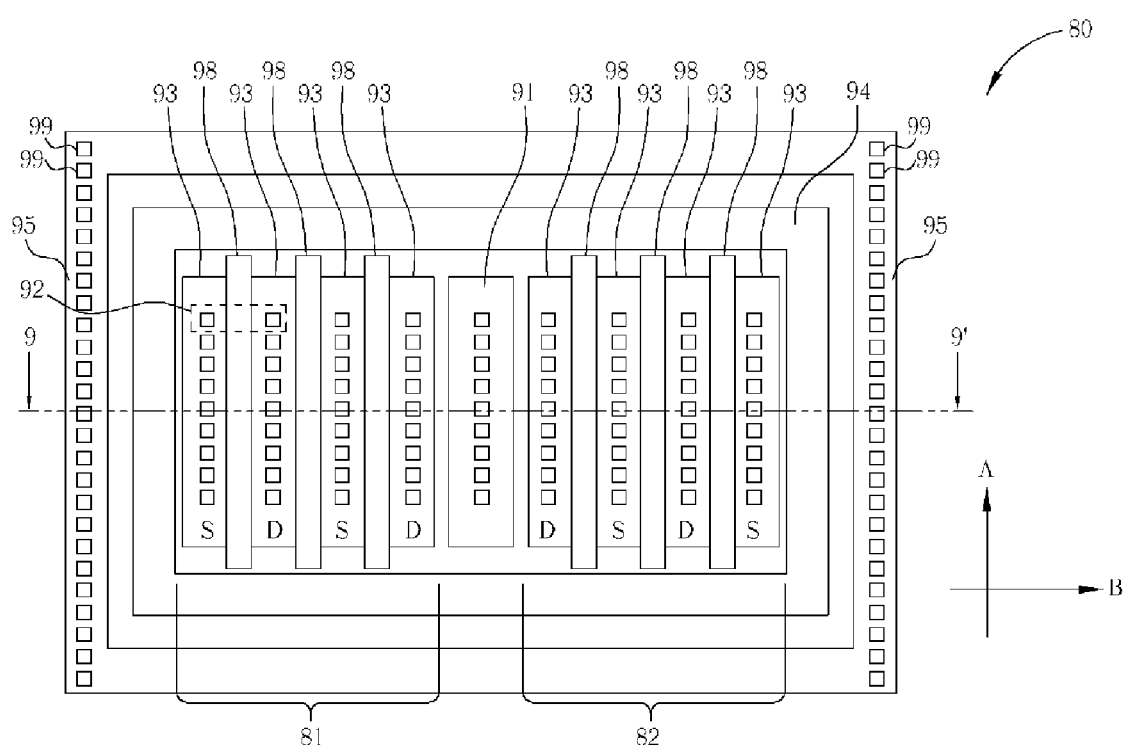
FIG. 8 is a layout diagram of first embodiment semiconductor device with ESD protection according to the present invention.
Figure 9:
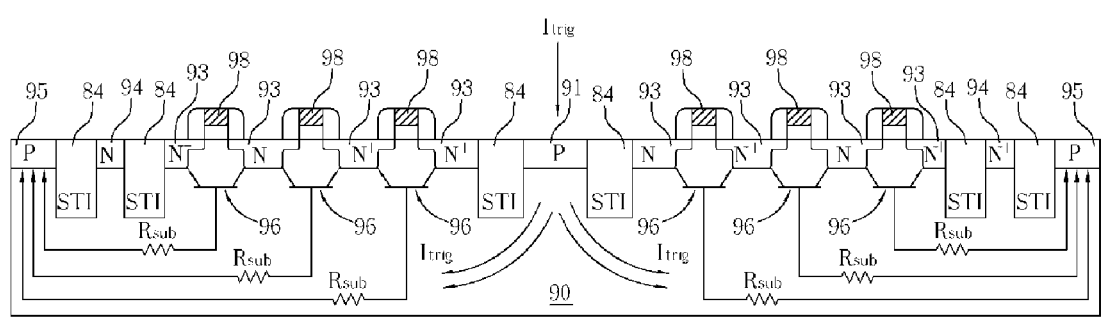
FIG. 9 is a cross-sectional diagram of the semiconductor device taken along a line 9–9' in FIG. 8.

Please refer to FIG. 8 and FIG. 9. FIG. 8 is a layout diagram of first embodiment semiconductor device 80 with ESD protection according to the present invention. FIG. 9 is a cross-sectional diagram of the semiconductor device 80 taken along a line 9–9' in FIG. 8. The semiconductor device 80 has a guard ring 95, a first MOS transistor array 81, a second MOS transistor array 82, a substrate-triggered portion 91, and an isolation portion 84. The first MOS transistor array 81, the second MOS transistor array 82, the substrate-triggered portion 91, and the isolation portion 84 are formed in a region surrounded by the guard ring 95. The substrate-triggered portion 91 is located between the first MOS transistor array 81 and the second MOS transistor array 82, and the substrate-triggered portion 91 extends along a first direction A. In addition, the isolation portion 84 is formed among the guard ring 95, the first MOS transistor array 81, the second MOS transistor array 82, and the substrate-triggered portion 91 so as to separate these regions. The isolation portion 84 can be a shallow trench isolation (STI) portion.

The MOS transistor array 81 and the MOS transistor array 82 have a plurality of MOS transistors 92 and a plurality of fingers 98 constituted by the gates of the MOS transistors 92. The finger-type gates 98 are parallel to each other and extend along the first direction A. As shown in FIG. 9, a plurality of N⁺ diffusion areas 93 and a plurality of P⁺ diffusion areas 95 are formed on a substrate 40. The N⁺ diffusion 93 areas serve as the source and the drain of the MOS transistors 92 shown in FIG. 8, respectively. The periphery P⁺ diffusion area 95 serves as the guard ring 95 shown in FIG. 8. The N⁺ diffusion areas 93 and the substrate 90 form the parasitic BJT 96. When the ESD event occurs, the trigger current $I_{trig}$ flows from the substrate-triggered portion 91 through the substrate 90 to the guard ring 95, and then the bases of parasitic BJT 96 is biased. The junction between the base and the emitter of the parasitic BJT 96 is forward biased by the ESD pulse, so the parasitic BJT 96 is triggered into an active region. Thus, the MOS transistor arrays 81 and 82 can be protected.

The semiconductor device 80 further comprises an N-well 94 and a plurality of contacting pads 99. The N-well 94 is formed on the substrate 90 and connected to the drains D of the MOS transistors 92. As shown in FIG. 8, the first MOS transistor array 81 and the second MOS transistor array 82 are surrounded by the N-well 94. The contacting pads 99 are formed on the guard ring 95 along the first direction A, and all of the contacting pads 99 are arranged as two lines oppositely positioned at two sides of the guard ring 95. It is noted that none of the contacting pads 99 is positioned at the upper side or the lower side of the guard ring 95. Consequently, the trigger current $I_{trig}$ passes from the substrate-triggered portion 91 through the substrate 90 to the two lines of contacting pads 99. The trigger current $I_{trig}$, thus, can more effectively bias the base of the parasitic BJT 96 in the first MOS transistor array 81 and the second MOS transistor array 82.

Figure 10:
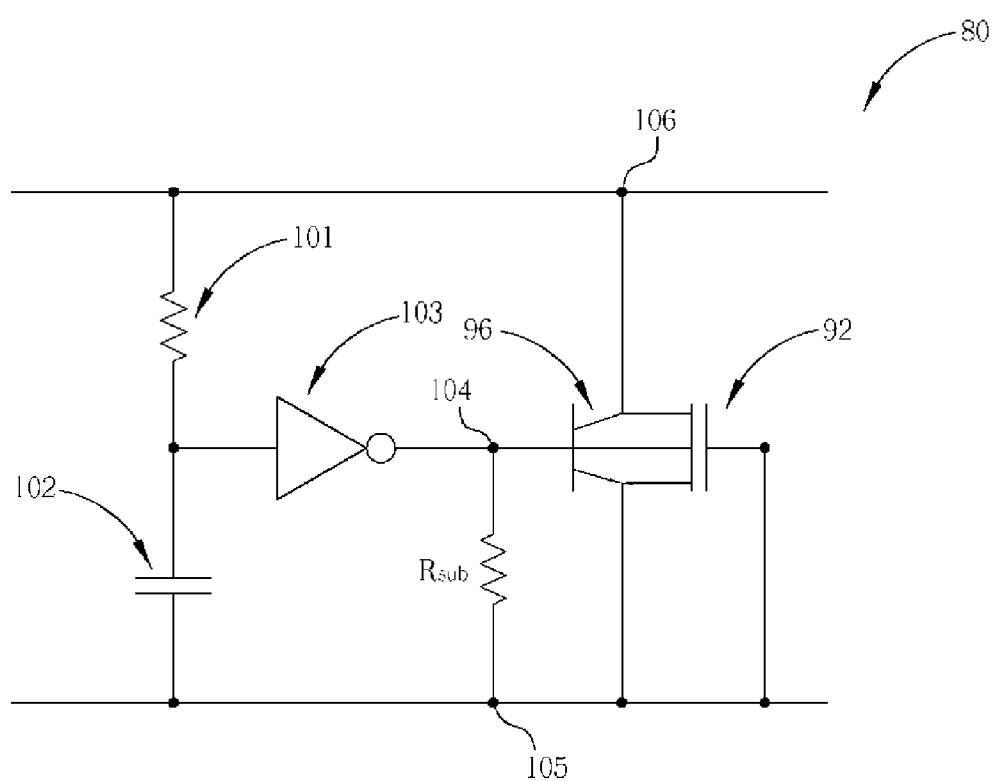
FIG. 10 is a circuit diagram of the semiconductor device shown in FIG. 8.

Pleases refer to FIGS. 8–10. FIG. 10 is a circuit diagram of the semiconductor device 80 shown in FIG. 8. The semiconductor device 80 further comprises a resistor 101, a capacitor 102, and an inverter 103. The resistor 101 and the capacitor 102 are used to determine the RC constant when an ESD event occurs, and the inverter 103 is used to activate the ESD protection of the semiconductor device 80 only when the ESD event occurs. The substrate-triggered portion 91 is connected to the output node 104 of the inverter 103, and the drains D of the MOS transistor 92 and the N-well 94 are connected together to the node 106. The gates 98 and the sources S are connected to the node 105, and the guard ring 95 is connected to the node 106 via the contacting pads 99. Therefore, when an ESD event occurs, the voltage level of the N-well 94 (node 106) is greater than the voltage level of the guard ring 95 (node 105) and the voltage level of the substrate-triggered portion 91 (node 104), and the voltage level of the substrate-triggered portion 91 (node 104) is greater than the voltage level of the guard ring 95 (node 105). Consequently, at this time, the trigger current $I_{trig}$ is simultaneously directed to both of the two lines of the contacting pads 99 by the N-well 94.

Figure 11:
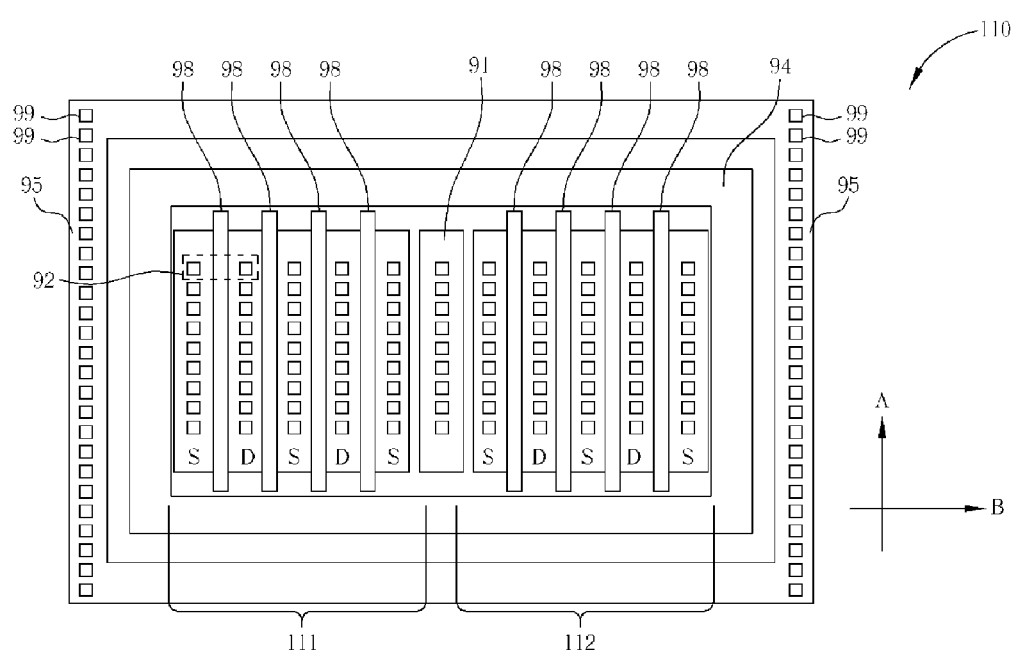
FIG. 11 is a layout diagram of second embodiment semiconductor device with ESD protection according to the present invention.

Please refer to FIGS. 8 and 11. FIG. 11 is a layout diagram of second embodiment semiconductor device 110 with ESD protection according to the present invention. The semiconductor device 110 also has a first MOS transistor array 111 and a second MOS transistor array 112. Each of the MOS transistor arrays 111 and 112 has a plurality of MOS transistors 92. The difference between the semiconductor device 80 and the semiconductor device 110 is that the substrate-triggered portion 91 of the semiconductor device 110 is adjacent to the sources S of the MOS transistors 92 and the substrate-triggered portion 91 of the semiconductor device 80 is adjacent to the drains D of the MOS transistors 92.

Figure 12:
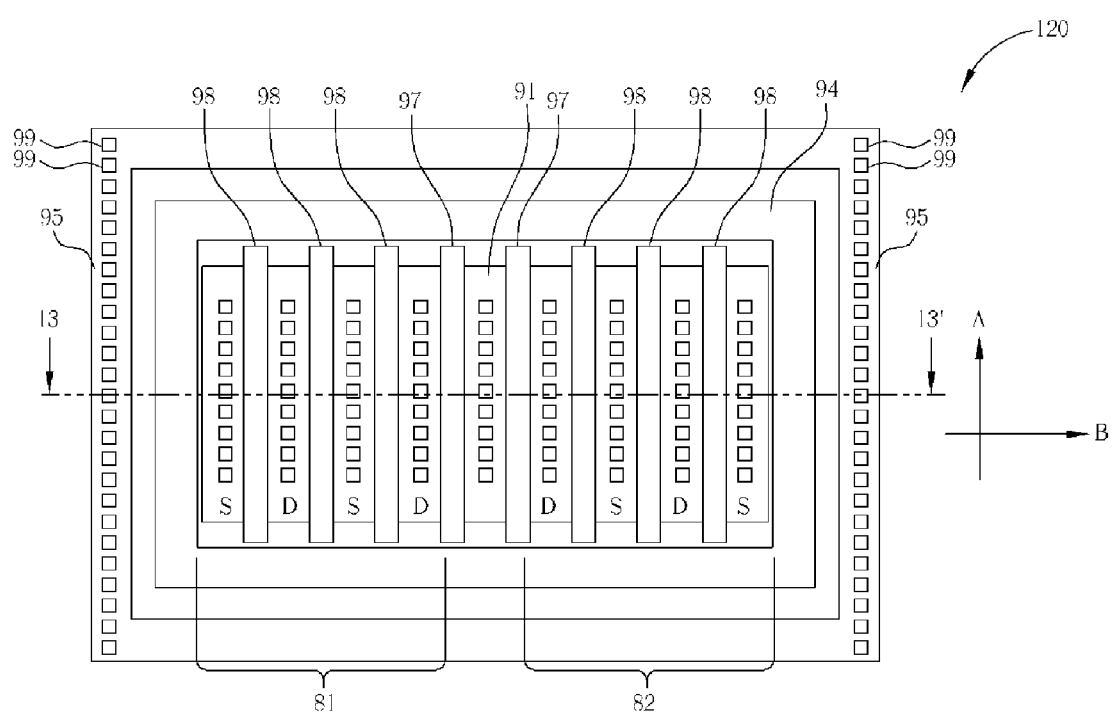
FIG. 12 is a layout diagram of third embodiment semiconductor device with ESD protection according to the present invention.
Figure 13:
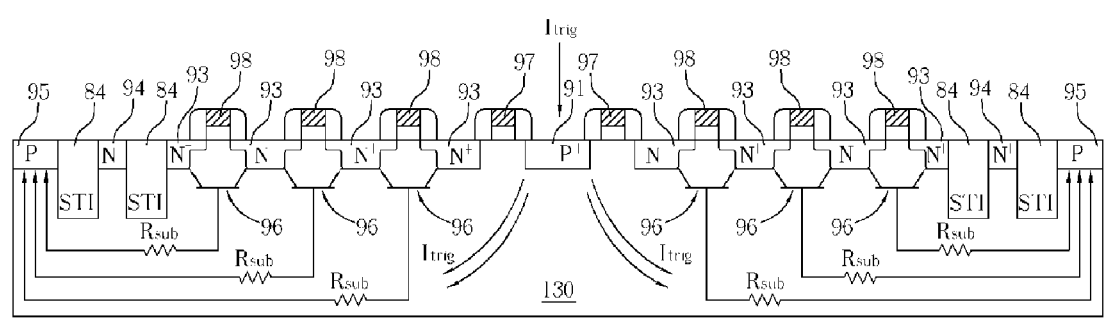
FIG. 13 is a cross-sectional diagram of the semiconductor device taken along a line 13–13' in FIG. 12.

Please refer to FIGS. 8–9 and 12–13. FIG. 12 is a layout diagram of third embodiment semiconductor device 120 with ESD protection according to the present invention. FIG. 13 is a cross-sectional diagram of the semiconductor device 120 taken along a line 13–13' in FIG. 12. Similar to the semiconductor device 80, the semiconductor device 120 also has a first MOS transistor array 81 and a second MOS transistor array 82. The isolation portion 84 adjacent to the substrate-triggered portion 91 of the semiconductor device 80 is replaced by two dummy-poly gates 97 of the semiconductor device 120. The two dummy-poly gates 97 are floating. One of the dummy-poly gates 97 is positioned between the substrate-triggered portion 91 and the first MOS transistor array 81, and the other dummy-poly gate 97 is positioned between the substrate-triggered portion 91 and the second MOS transistor array 82.

Figure 14:
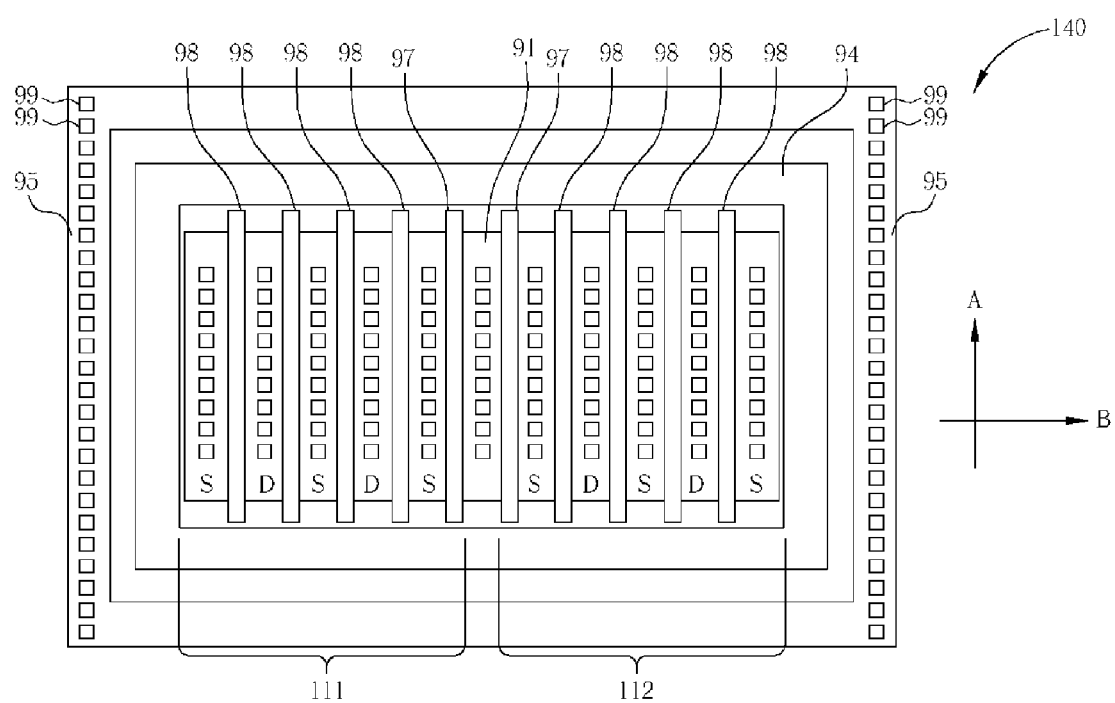
FIG. 14 is a layout diagram of fourth embodiment semiconductor device with ESD protection according to the present invention.

Please refer to FIGS. 11 and 14. FIG. 14 is a layout diagram of fourth embodiment semiconductor device 140 with ESD protection according to the present invention. The semiconductor device 140 also has a first MOS transistor array 111 and a second MOS transistor array 112. The isolation portion 84 adjacent to the substrate-triggered portion 91 of the semiconductor device 110 is replaced by two dummy-poly gates 97 of the semiconductor device 140.

Figure 15:
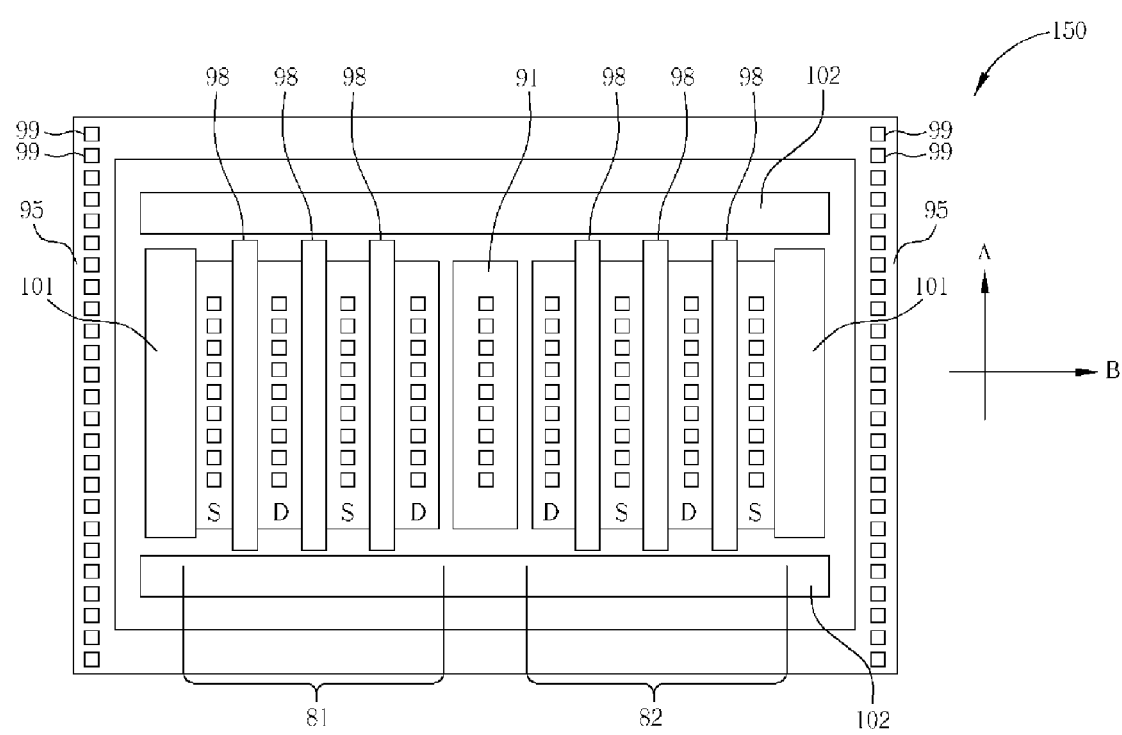
FIG. 15 is a layout diagram of fifth embodiment semiconductor device with ESD protection according to the present invention.

Please refer to FIGS. 8, 10, and 15. FIG. 15 is a layout diagram of fifth embodiment semiconductor device 150 with ESD protection according to the present invention. The difference between the semiconductor device 80 and the semiconductor device 150 is that the N-well 94 of the semiconductor device 80 is replaced by two first N-wells 102 and two second N-wells 101. Each of the first N-wells 102 extends along a second direction B that is perpendicular to the first direction A, and each of the second N-wells 101 extends along the first direction A. The two first N-wells 102 are connected to the drains D of the MOS transistors 92 of the MOS transistor arrays 81 and 82, i.e. the node 106 shown in FIG. 10. The two second N-wells 101 are connected to a power terminal Vss, i.e. the node 105 shown in FIG. 10. When an ESD occurs, due to the blocking effects of the two first N-wells 102, the trigger current components toward the first N-wells 102 decrease. The trigger current, thus, more effectively flows to the contacting pads 99 positioned at the left side and the right side of the guard ring 95.

Figure 16:
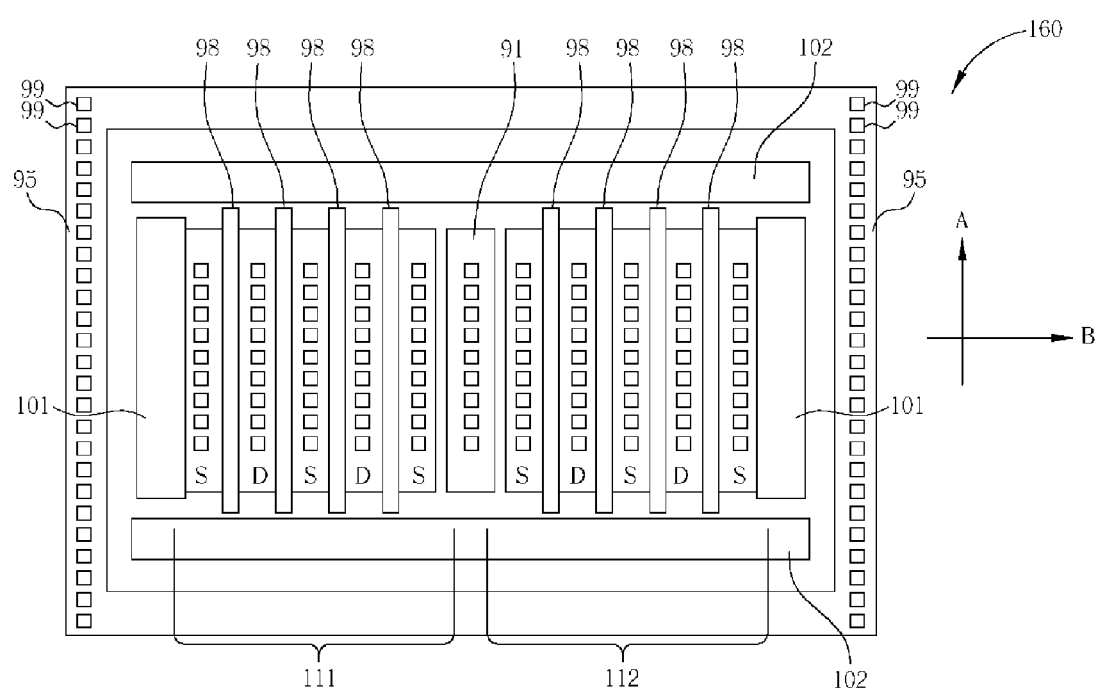
FIG. 16 is a layout diagram of sixth embodiment semiconductor device with ESD protection according to the present invention.

Please refer to FIGS. 15 and 16. FIG. 16 is a layout diagram of sixth embodiment semiconductor device 160 with ESD protection according to the present invention. The semiconductor device 160 also has a first MOS transistor array 111 and a second MOS transistor array 112. The difference between the semiconductor device 150 and the semiconductor device 160 is that the substrate-triggered portion 91 of the semiconductor device 160 is adjacent to the sources S of the MOS transistors 92 and the substrate-triggered portion 91 of the semiconductor device 150 is adjacent to the drains D of the MOS transistors 92.

Figure 17:
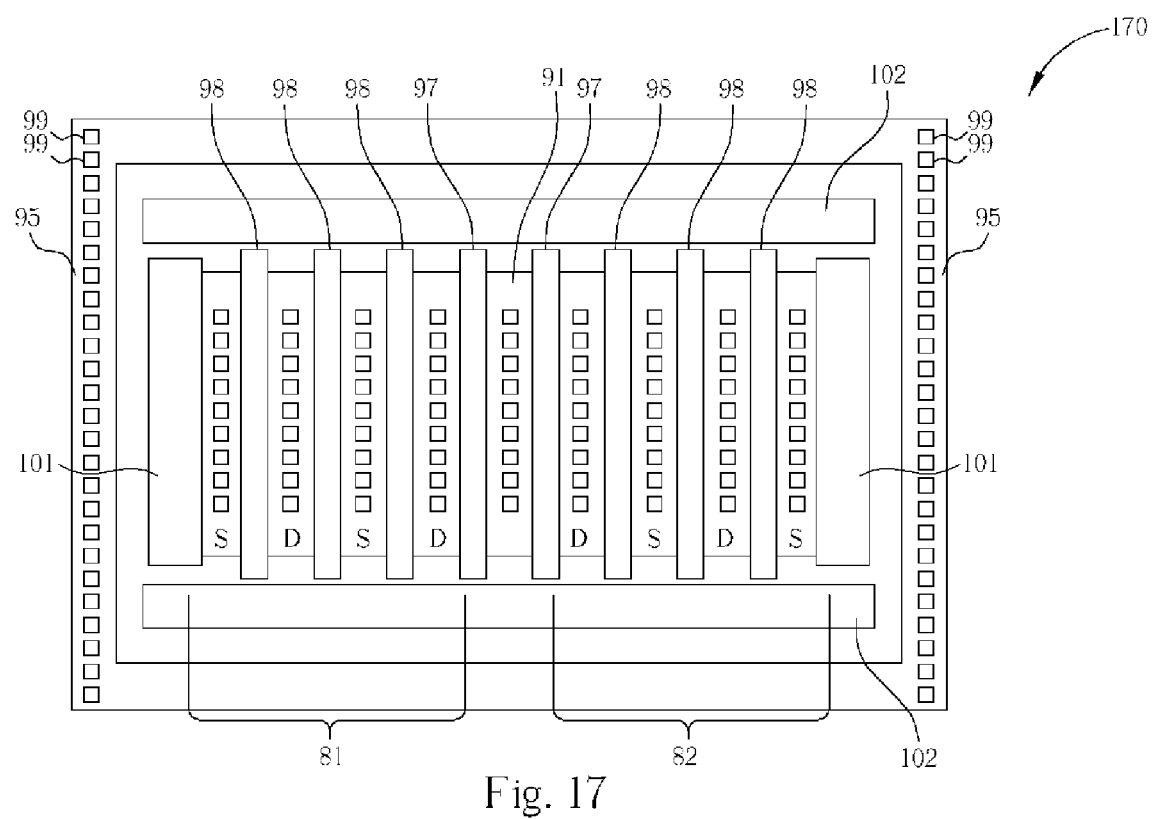
FIG. 17 is a layout diagram of seventh embodiment semiconductor device with ESD protection according to the present invention.

Please refer to FIGS. 15 and 17. FIG. 17 is a layout diagram of seventh embodiment semiconductor device 170 with ESD protection according to the present invention. Similar to the semiconductor device 150, the semiconductor device 170 also has a first MOS transistor array 81 and a second MOS transistor array 82. The isolation portion 84 adjacent to the substrate-triggered portion 91 of the semiconductor device 150 is replaced by two dummy-poly gates 97 of the semiconductor device 170. The two dummy-poly gates 97 are floating. One of the dummy-poly gates 97 is positioned between the substrate-triggered portion 91 and the first MOS transistor array 81, and the other dummy-poly gate 97 is positioned between the substrate-triggered portion 91 and the second MOS transistor array 82.

Figure 18:
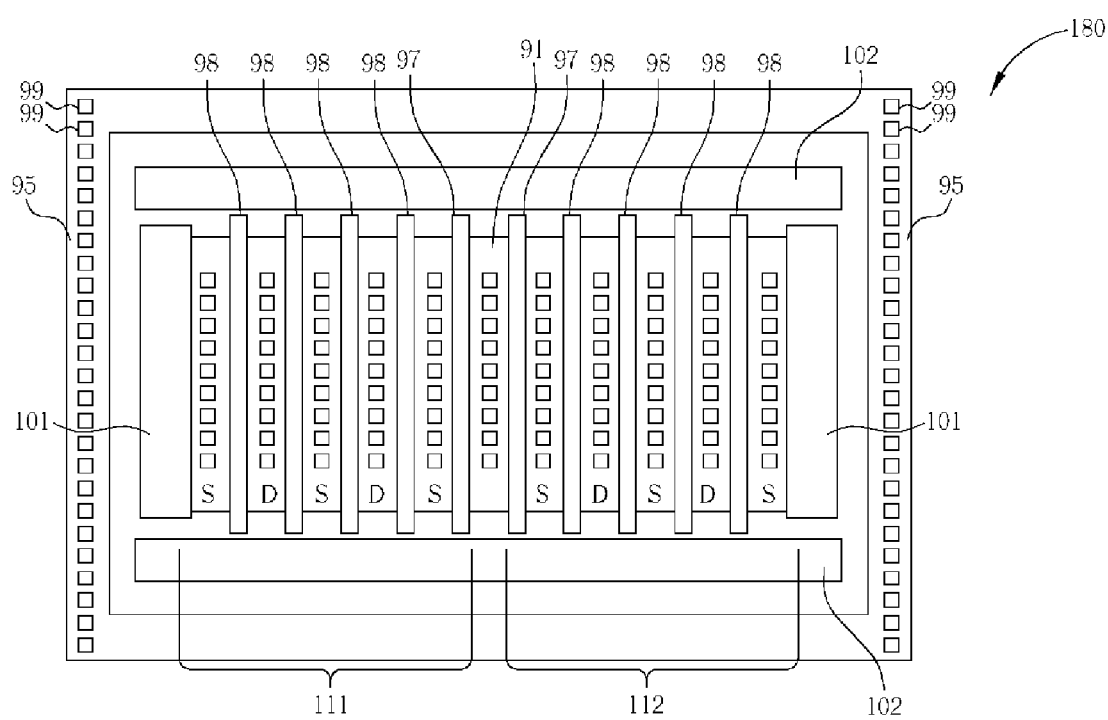
FIG. 18 is a layout diagram of eighth embodiment semiconductor device with ESD protection according to the present invention.

Please refer to FIGS. 16 and 18. FIG. 18 is a layout diagram of eighth embodiment semiconductor device 180 with ESD protection according to the present invention. Similar to the semiconductor device 160, the semiconductor device 180 also has a first MOS transistor array 81 and a second MOS transistor array 82. The isolation portion 84 adjacent to the substrate-triggered portion 91 of the semiconductor device 160 is replaced by two dummy-poly gates 97 of the semiconductor device 180.

Figure 19:
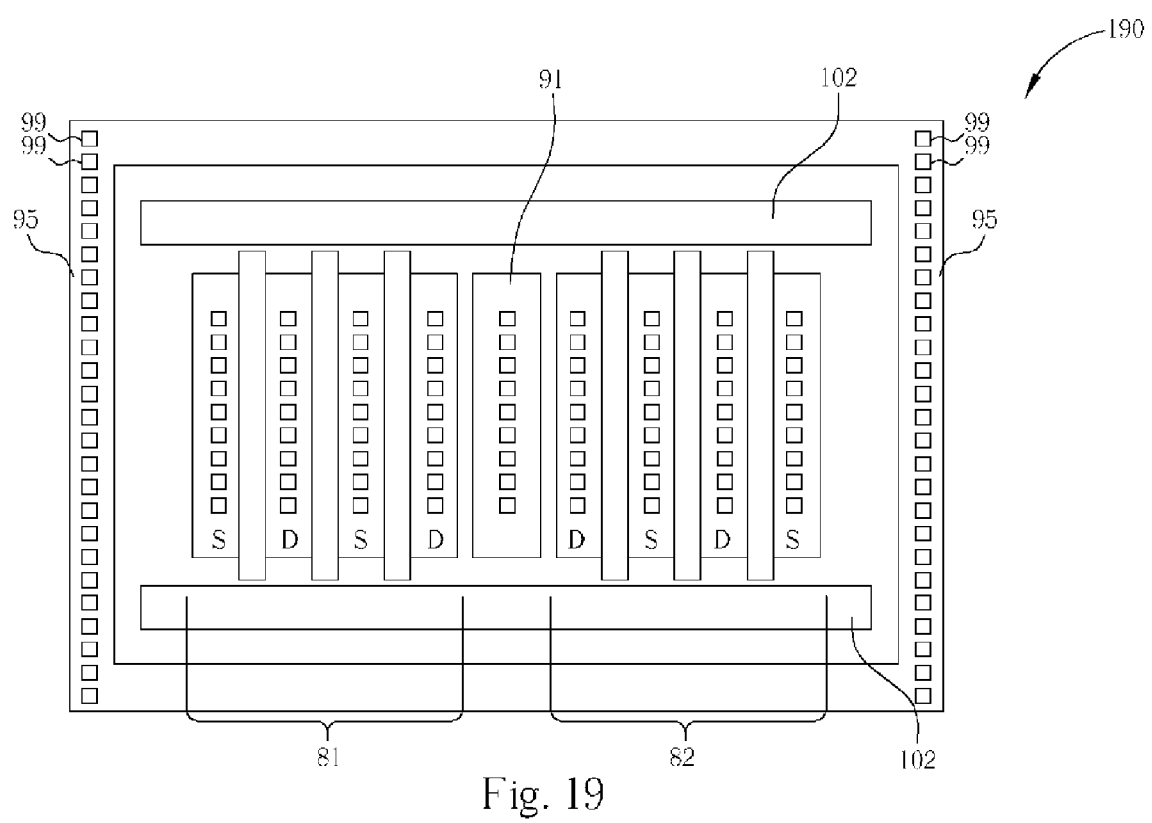
FIG. 19 is a layout diagram of ninth embodiment semiconductor device with ESD protection according to the present invention.

Please refer to FIGS. 15, and 19. FIG. 19 is a layout diagram of ninth embodiment semiconductor device 190 with ESD protection according to the present invention. The difference between the semiconductor device 150 and the semiconductor device 190 is that the two second N-wells 101 of the semiconductor device 150 are omitted in the semiconductor device 190. The two first N-wells 102 of the semiconductor device 190 are connected to the drains D of the MOS transistors 92 of the MOS transistor arrays 81 and 82 so as to direct the trigger current to both of the two lines of the contacting pads 99 when an ESD event occurs.

Figure 20:
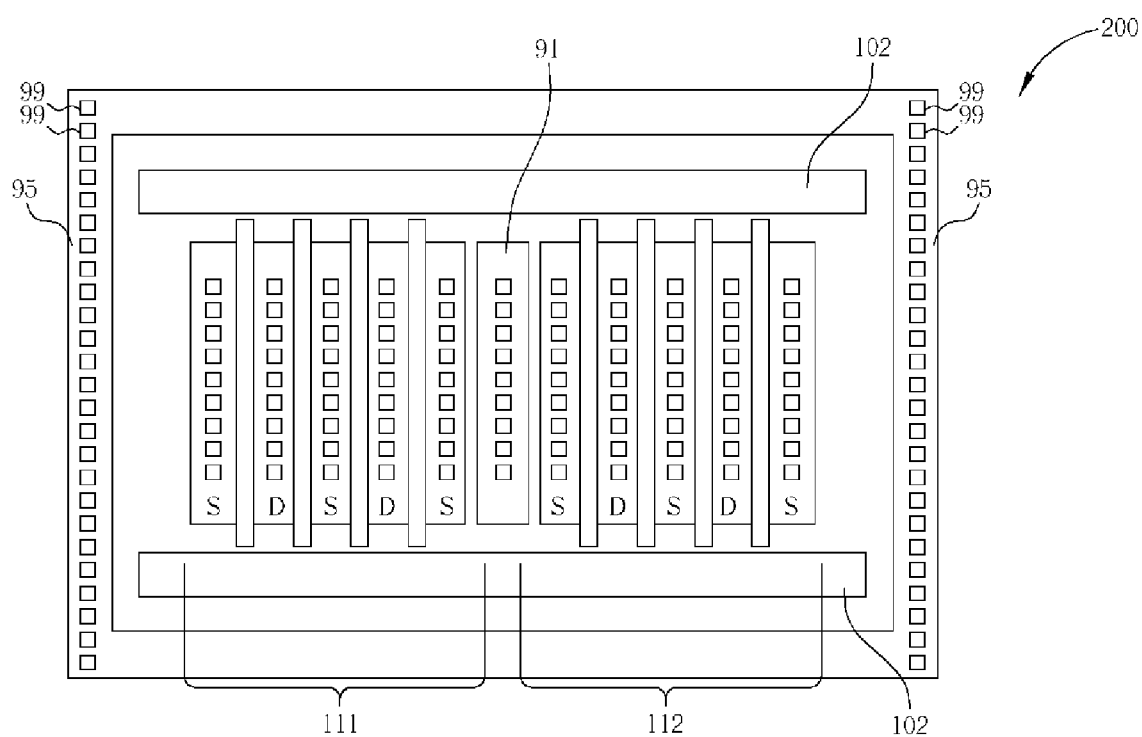
FIG. 20 is a layout diagram of tenth embodiment semiconductor device with ESD protection according to the present invention.

Please refer to FIGS. 19 and 20. FIG. 20 is a layout diagram of tenth embodiment semiconductor device 200 with ESD protection according to the present invention. The semiconductor device 200 also has a first MOS transistor array 111 and a second MOS transistor array 112. The difference between the semiconductor device 190 and the semiconductor device 200 is that the substrate-triggered portion 91 of the semiconductor device 200 is adjacent to the sources S of the MOS transistors 92 and the substrate-triggered portion 91 of the semiconductor device 190 is adjacent to the drains D of the MOS transistors 92.

Figure 21:
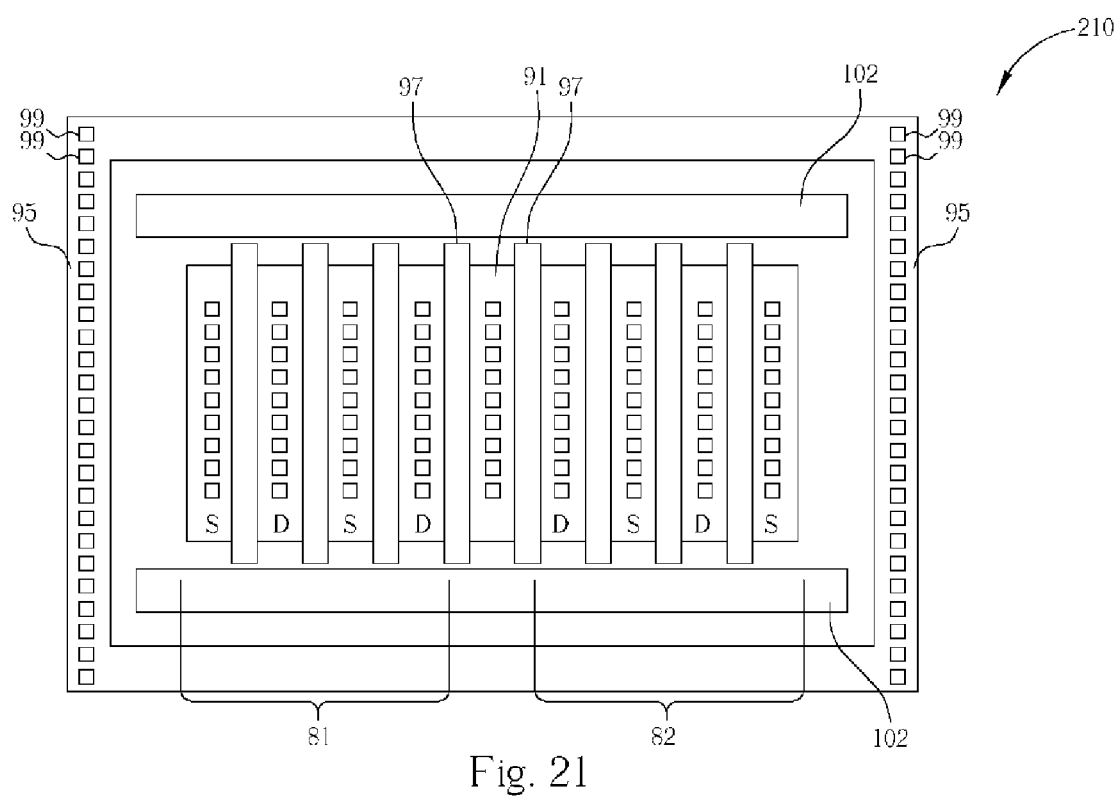
FIG. 21 is a layout diagram of eleventh embodiment semiconductor device with ESD protection according to the present invention.

Please refer to FIGS. 19 and 21. FIG. 21 is a layout diagram of eleventh embodiment semiconductor device 210 with ESD protection according to the present invention. Similar to the semiconductor device 190, the semiconductor device 210 also has a first MOS transistor array 81 and a second MOS transistor array 82. The isolation portion 84 adjacent to the substrate-triggered portion 91 of the semiconductor device 190 is replaced by two dummy-poly gates 97 of the semiconductor device 210. The two dummy-poly gates 97 are floating.

Figure 22:
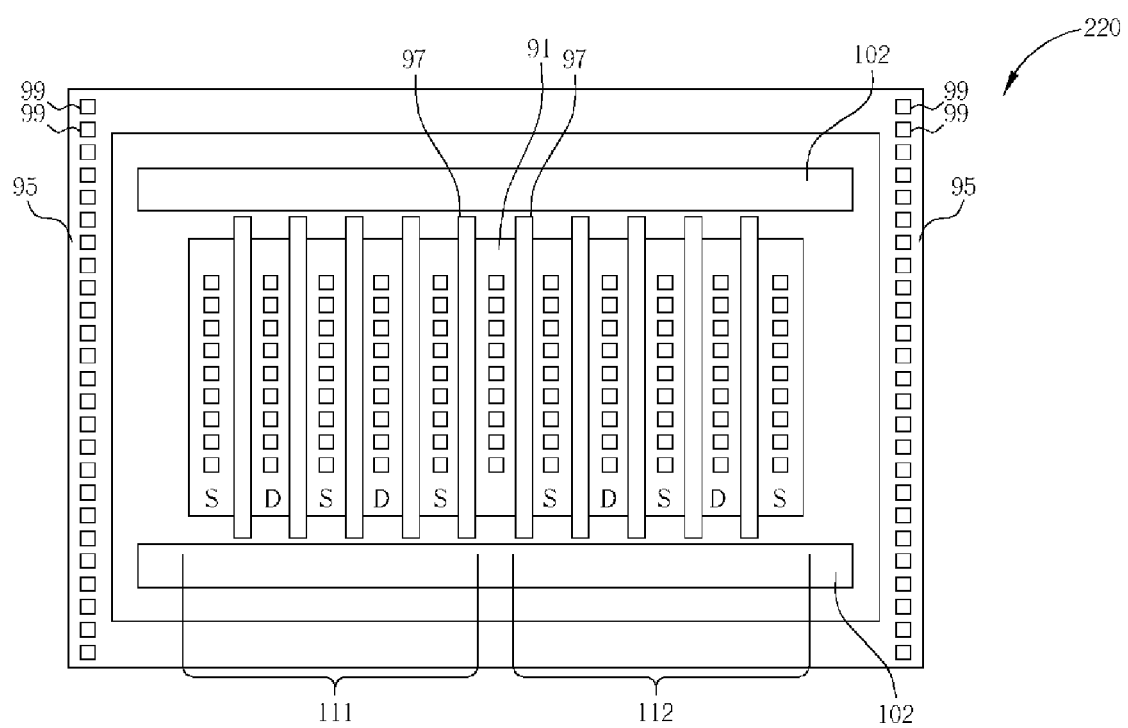
FIG. 22 is a layout diagram of twelfth embodiment semiconductor device with ESD protection according to the present invention.

Please refer to FIGS. 20 and 22. FIG. 22 is a layout diagram of twelfth embodiment semiconductor device 220 with ESD protection according to the present invention. Similar to the semiconductor device 200, the semiconductor device 220 also has a first MOS transistor array 81 and a second MOS transistor array 82. The isolation portion 84 adjacent to the substrate-triggered portion 91 of the semiconductor device 200 is replaced by two floating dummy-poly gates 97 of the semiconductor device 220.

In contrast to the prior semiconductor device with substrate-triggered ESD protection, each of semiconductor devices with substrate-triggered ESD protection according to the present invention has a different layout. All of the contacting pads formed on the guard ring are located at two of the four sides of the guard ring. The parasitic BJT of the semiconductor device, thus, can be more effectively triggered into the active region. When an ESD occurs, an N-well is biased to simultaneously direct the trigger current to both of the two lines of the contacting pads. Therefore, the turn-on efficiency of ESD protection of the semiconductor devices is improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device with substrate-triggered electrostatic discharge (ESD) protection, comprising:
    a guard ring formed in a substrate for surrounding a region having four sides;
    a plurality of contacting pads formed on the guard ring along a first direction and arranged as two lines oppositely positioned at two of the four sides of the guard ring, none of the contacting pads is positioned at the other two sides of the guard ring, and the guard ring is connected to a first node via die contacting pads;
    a first metal-oxide-semiconductor (MOS) transistor array formed in the region and having at least one first finger-type gate extending along the first direction;
    a second MOS transistor array formed in the region and having at least one second finger-type gate extending along the first direction;
    a substrate-triggered portion formed in the region along the first direction and positioned between the first MOS transistor array and the second MOS transistor array;
    two rows of first N-wells formed in the region and connected to drains of the MOS transistors, the first N-wells being extending merely along a second direction perpendicular to the first direction; and
    two columns of second N-wells formed in the region and connected to the first node, the second N-wells being extending along the first direction, wherein the two rows of first N-wells and the two columns of second N-wells together encompass the first and second MOS transistor arrays.

2. The semiconductor device of claim 1 further comprising:
    an isolation portion formed among the guarding ring, the first MOS transistor array, the second MOS transistor array, and the substrate-triggered portion.

3. The semiconductor device of claim 2 wherein the isolation portion is a shallow trench isolation (STI) portion.

4. The semiconductor device of claim 1 further comprising:
    two floating dummy-poly gates formed in the region extending along the first direction, wherein one of the dummy-poly gates is positioned between the substrate-triggered portion and the first MOS transistor array, and the other dummy-poly gate is positioned between the substrate-triggered portion and the second MOS transistor array.

5. The semiconductor device of claim 1 wherein the substrate-triggered portion is a $P^+$ diffusion area.

6. The semiconductor device of claim 1 wherein when an ESD event occurs, a trigger current passes through the substrate simultaneously from the substrate-triggered portion to both of the two lines of the contacting pads, so as to bias bases of parasitic bipolar junction transistors (BJTs) in the first MOS transistor array and in the second MOS transistor array.

7. A semiconductor device with substrate-triggered electrostatic discharge (ESD) protection, comprising:
    a guard ring formed in a substrate for surrounding a region having four sides;
    a plurality of contacting pads formed on the guard ring along a first direction and arranged as two lines oppositely positioned at two of the four sides of the guard ring, none of the contacting pads is positioned at the other two sides of the guard ring, and the guard ring is connected to a first node via the contacting pads;

a first metal-oxide-semiconductor (MOS) transistor array formed in the region and having at least one first finger-type gate extending along the first direction;

a second MOS transistor array formed in the region and having at least one second finger-type gate extending along the first direction;

a substrate-triggered portion formed in the region along the first direction and positioned between the first MOS transistor array and the second MOS transistor array;

at least a row of first N-well formed in the region disposed merely along a second direction perpendicular to the first direction, and the first N-well being connected to drains of the MOS transistors for simultaneously directing a trigger current to both of the two lines of the contacting pads when an ESD event occurs, wherein the first N-well does not overlap the drains of the MOS transistors; and two columns of second N-wells formed in the region and connected to the first node, the second N-wells being extending along the first direction.

8. The semiconductor device of claim 7 further comprising:
an isolation portion formed among the guarding ring, the first MOS transistor array, the second MOS transistor array, and the substrate-triggered portion.

9. The semiconductor device of claim 8 wherein the isolation portion is a shallow trench isolation (STI) portion.

10. The semiconductor device of claim 7 further comprising:
two floating dummy-poly gates formed in the region extending along the first direction, wherein one of the dummy-poly gates is positioned between the substrate-triggered portion and the first MOS transistor array, and the other dummy-poly gate is positioned between the substrate-triggered portion and the second MOS transistor array.

11. The semiconductor device of claim 7 wherein the substrate-triggered portion is a P$^+$ diffusion area.

12. The semiconductor device of claim 7 wherein when the ESD event occurs, the trigger current passes through the substrate simultaneously from the substrate-triggered portion to both of the two lines of the contacting pads, so as to bias bases of parasitic bipolar junction transistors (BJTs) in the first MOS transistor array and in the second MOS transistor array.

13. A semiconductor device with substrate-triggered electrostatic discharge (ESD) protection, comprising:
a guard ring formed in a substrate for surrounding a region having four sides;
a plurality of contacting pads formed on the guard ring along a first direction and arranged as two lines oppositely positioned at two of the four sides of the guard ring, none of the contacting pads is positioned at the other two sides of the guard ring, and the guard ring is connected to a first node via the contacting pads;
a first metal-oxide-semiconductor (MOS) transistor array formed in the region and having at least one first finger-type gate extending along the first direction;
a second MOS transistor array formed in the region and having at least one second finger-type gate extending along the first direction;
a substrate-triggered portion formed in the region along the first direction and positioned between the first MOS transistor array and the second MOS transistor array; and two of first N-wells formed in the region disposed merely along a second direction perpendicular to the first direction, and the first N-well being connected to drains of the MOS transistors, the first and second MOS transistor arrays being positioned between the two rows of first N-wells, wherein the first direction is substantially perpendicular to the second direction.

14. The semiconductor device of claim 13 further comprising:
two second N-wells formed in the region and connected to the first node, the second N-wells being extending along the first direction.

15. The semiconductor device of claim 13 further comprising:
an isolation portion formed among the guarding ring, the first MOS transistor array, the second MOS transistor array, and the substrate-triggered portion.

16. The semiconductor device of claim 15 wherein the isolation portion is a shallow trench isolation (STI) portion.

17. The semiconductor device of claim 13 further comprising:
two floating dummy-poly gates formed in the region extending along the first direction, wherein one of the dummy-poly gates is positioned between the substrate-triggered portion and the first MOS transistor array, and the other dummy-poly gate is positioned between the substrate-triggered portion and the second MOS transistor array.

18. The semiconductor device of claim 13 wherein the substrate-triggered portion is a P$^+$ diffusion area.

19. The semiconductor device of claim 13 wherein when an ESD event occurs, a trigger current passes through the substrate simultaneously from the substrate-triggered portion to both of the two lines of the contacting pads, so as to bias bases of parasitic bipolar junction transistors (BJTs) in the first MOS transistor array and in the second MOS transistor array.

20. A semiconductor device with substrate-triggered electrostatic discharge (ESD) protection, comprising:
a guard ring formed in a substrate for surrounding a region having four sides;
a plurality of contacting pads formed on the guard ring along a first direction and arranged as two lines oppositely positioned at two of the four sides of the guard ring, none of the contacting pads is positioned at the other two sides of the guard ring, and the guard ring is connected to a first node via the contacting pads;
a first metal-oxide-semiconductor (MOS) transistor array formed in the region and having at least one first finger-type gate extending along the first direction;
a second MOS transistor array formed in the region and having at least one second finger-type gate extending along the first direction;
a substrate-triggered portion formed in the region along the first direction and positioned between the first MOS transistor array and the second MOS transistor array; and
an N-well formed in the region being connected to drains of the MOS transistors, wherein the first MOS transistor array and the second MOS transistor array are surrounded by the N-well.

21. The semiconductor device of claim 20 further comprising:

an isolation portion formed among the guarding ring, the first MOS transistor array, the second MOS transistor array, and the substrate-triggered portion.

22. The semiconductor device of claim 21 wherein the isolation portion is a shallow trench isolation (STI) portion.

23. The semiconductor device of claim 20 further comprising:

two floating dummy-poly gates formed in the region extending along the first direction, wherein one of the dummy-poly gates is positioned between the substrate-triggered portion and the first MOS transistor array, and the other dummy-poly gate is positioned between the substrate-triggered portion and the second MOS transistor array.

24. The semiconductor device of claim 20 wherein the substrate-triggered portion is a $P^+$ diffusion area.

25. The semiconductor device of claim 20 wherein when an ESD event occurs, a trigger current passes through the substrate simultaneously from the substrate-triggered portion to both of the two lines of the contacting pads, so as to bias bases of parasitic bipolar junction transistors (BJTs) in the first MOS transistor array and
in the second MOS transistor array.

* * * * *